United States Patent
Ng et al.

(10) Patent No.: US 12,380,311 B2
(45) Date of Patent: Aug. 5, 2025

(54) ARTICLES OF MANUFACTURE RELATING TO IC MODULES AND SMART CARDS

(71) Applicant: SMARTFLEX TECHNOLOGY PTE LTD, Singapore (SG)

(72) Inventors: Eng Seng Ng, Singapore (SG); Sze Yong Pang, Singapore (SG)

(73) Assignee: SMARTFLEX TECHNOLOGY PTE LTD, Singapore (SG)

( * ) Notice: Subject to any disclaimer, the term of this patent is extended or adjusted under 35 U.S.C. 154(b) by 0 days.

(21) Appl. No.: 18/861,562

(22) PCT Filed: Sep. 27, 2023

(86) PCT No.: PCT/SG2023/050644
§ 371 (c)(1),
(2) Date: Oct. 29, 2024

(87) PCT Pub. No.: WO2024/196307
PCT Pub. Date: Sep. 26, 2024

(65) Prior Publication Data
US 2025/0139400 A1    May 1, 2025

Related U.S. Application Data

(60) Provisional application No. 63/491,732, filed on Mar. 22, 2023.

(51) Int. Cl.
G06K 19/077 (2006.01)
G06K 19/07 (2006.01)
H01L 23/498 (2006.01)

(52) U.S. Cl.
CPC ... G06K 19/07754 (2013.01); G06K 19/0718 (2013.01); G06K 19/07705 (2013.01); H01L 23/49855 (2013.01)

(58) Field of Classification Search
CPC ......... G06K 19/07754; G06K 19/0718; G06K 19/07705
(Continued)

(56) References Cited

U.S. PATENT DOCUMENTS 6,031,724 A    2/2000  Takahashi
2017/0316303 A1* 11/2017 Pachler ............ G06K 19/07769
(Continued)

FOREIGN PATENT DOCUMENTS

DE    102016107982 A1    11/2017

*Primary Examiner* — Allyson N Trail
(74) *Attorney, Agent, or Firm* — Cuenot, Forsythe & Kim LLC; Stanley A. Kim

(57) ABSTRACT

The present disclosure relates to carrier tapes, IC modules, and smart card devices. According to one embodiment, an article of manufacture comprises: a non-conductive substrate having a front side and a rear side, and a plurality of through holes extending from the front side to the rear side; a smart card contact area arranged on the front side of the substrate and having a plurality of conductive pads which are mutually insulated and close front-side ends of the through holes; a plurality of through-hole solder pads and a plurality of conductive traces arranged on the rear side of the substrate, wherein the through-hole solder pads are arranged at rear-side ends of the through holes, wherein the conductive traces are conductively coupled to the through-hole solder pads respectively; and a solder mask at least partially overlaying the conductive traces.

29 Claims, 9 Drawing Sheets

(58) Field of Classification Search
USPC .......................................................... 235/492
See application file for complete search history.

(56) References Cited

U.S. PATENT DOCUMENTS

| | | | |
|---|---|---|---|
| 2019/0087622 A1* | 3/2019 | Benkley, III | G06V 40/1394 |
| 2019/0294943 A1* | 9/2019 | Ng | G06K 19/07769 |
| 2023/0065796 A1* | 3/2023 | Zinn | H05K 1/097 |
| 2023/0252260 A1* | 8/2023 | Doering | G06K 19/07775 |
| | | | 235/488 |
| 2024/0105703 A1* | 3/2024 | Lim | H01L 24/41 |
| 2024/0203842 A1* | 6/2024 | Ye | H01L 25/18 |
| 2024/0357730 A1* | 10/2024 | Biliga-Nisipeanu | H05K 1/112 |
| 2025/0024586 A1* | 1/2025 | Farkas | H01P 3/081 |

* cited by examiner

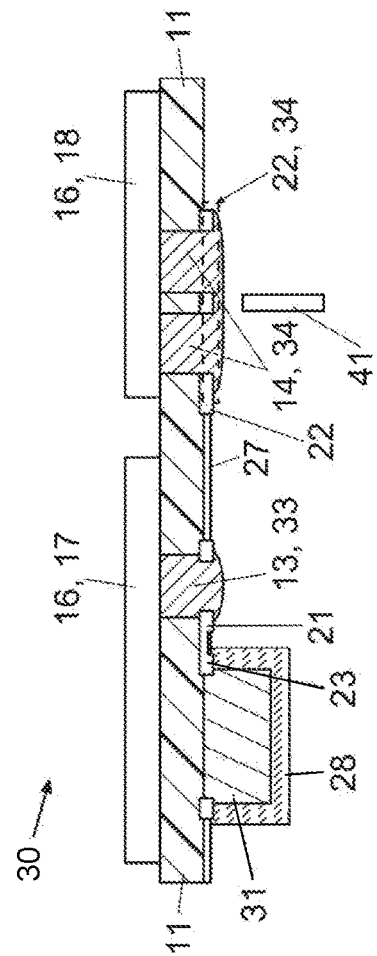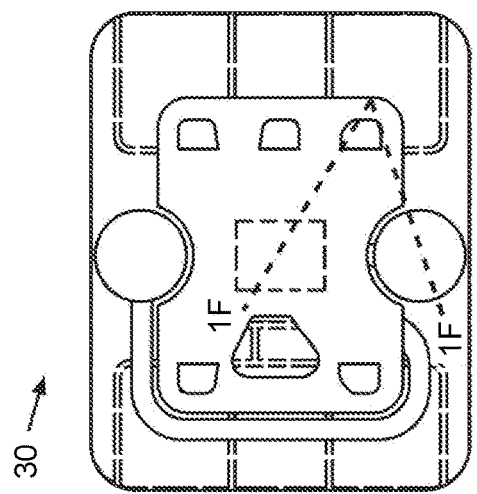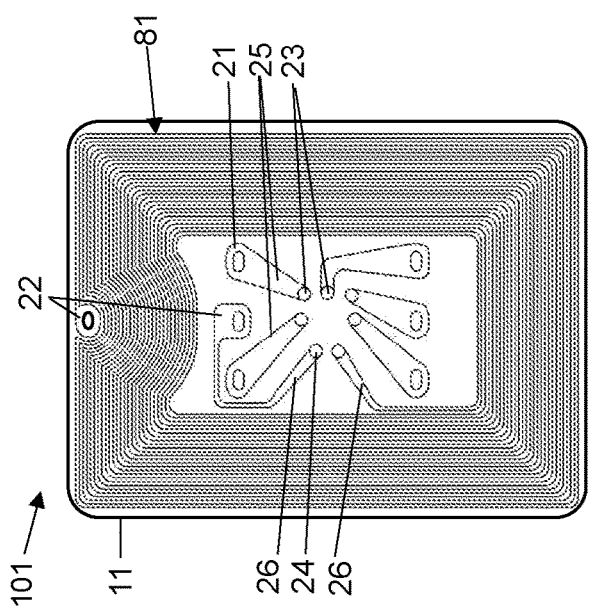
Figure 1F
Figure 1E
Figure 1G

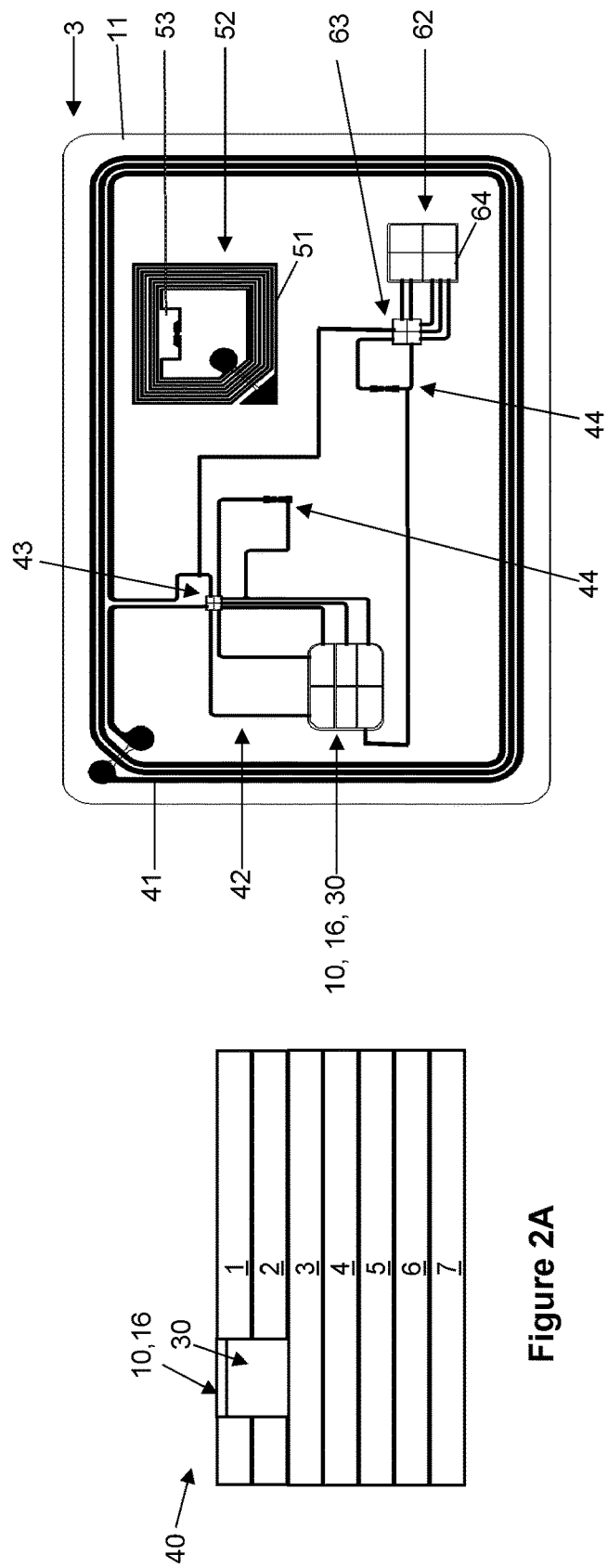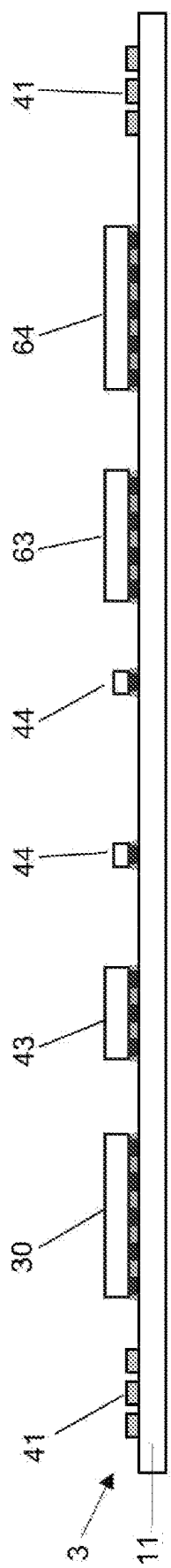
Figure 2B
Figure 2C
Figure 2A

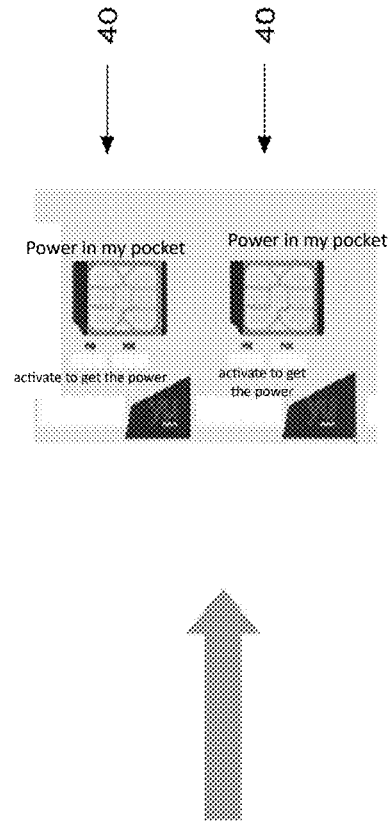
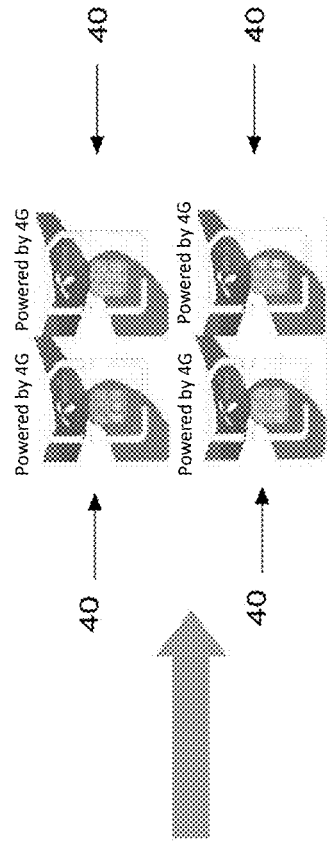
Figure 4A
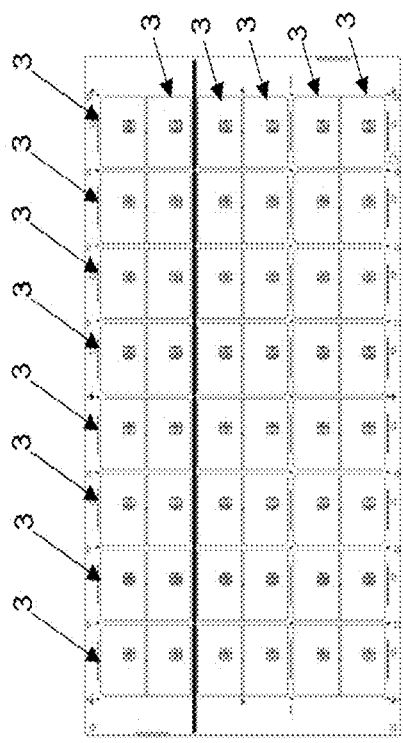
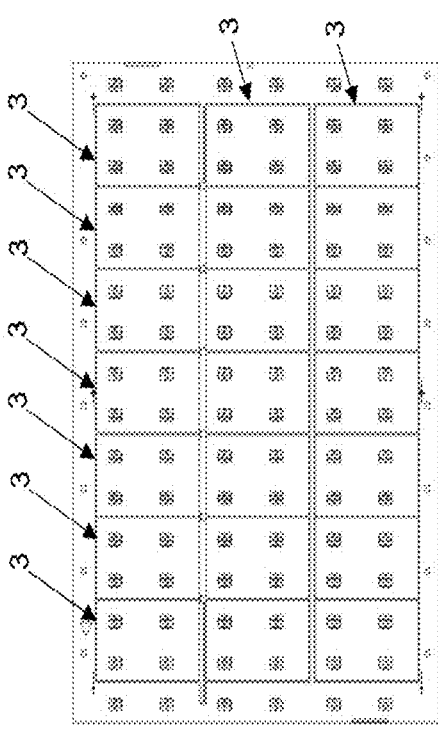
Figure 4B

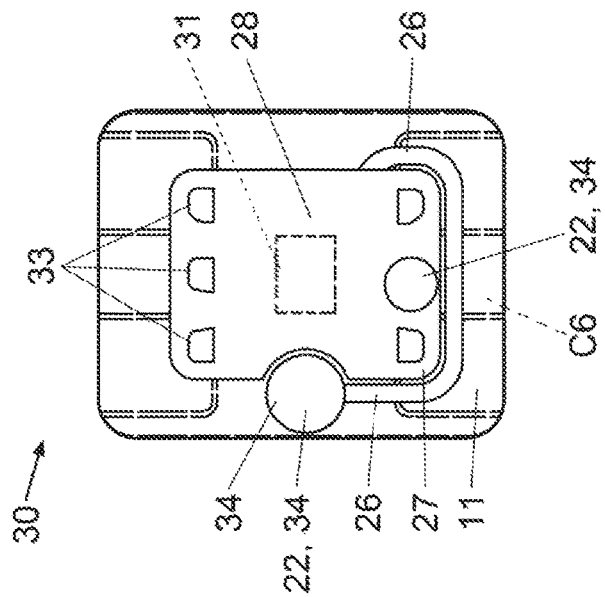
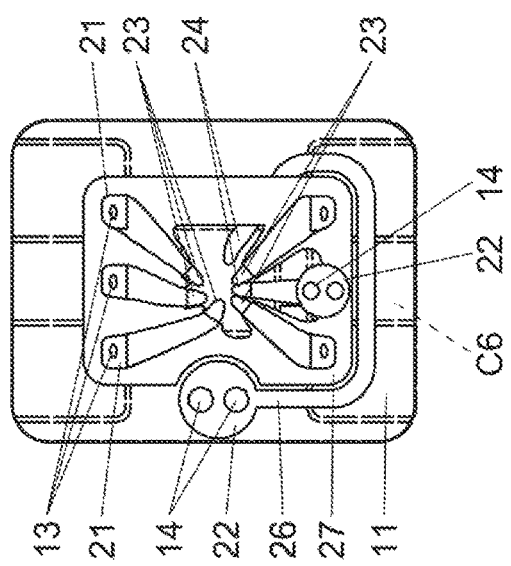
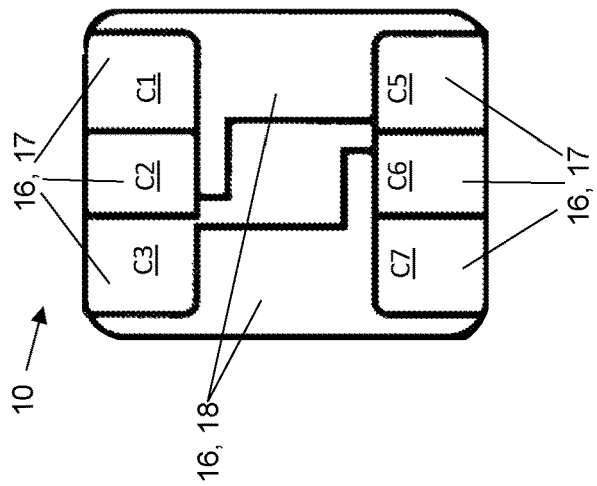

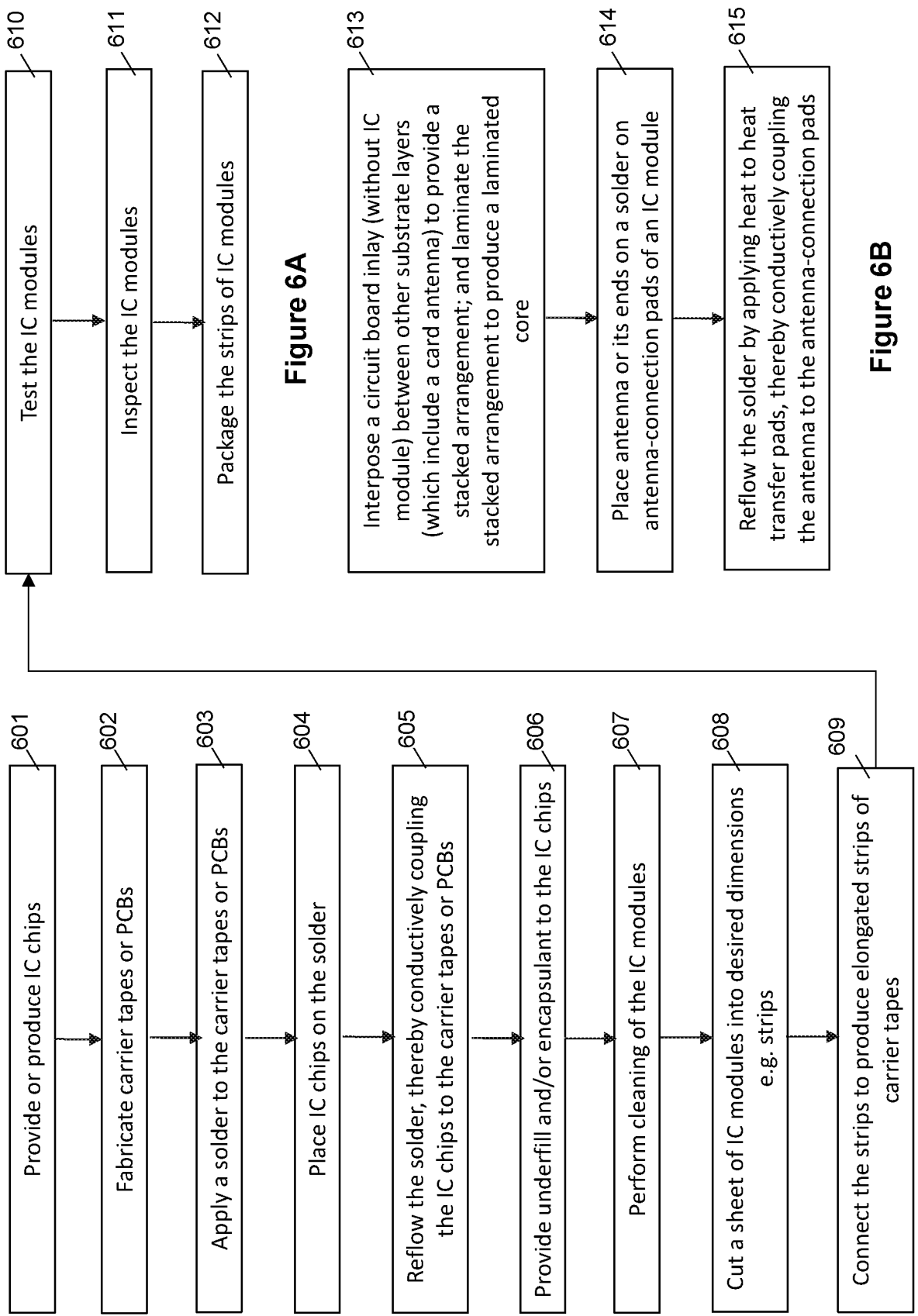

ARTICLES OF MANUFACTURE RELATING TO IC MODULES AND SMART CARDS

CROSS REFERENCE TO RELATED APPLICATIONS

The present application is the U.S. national phase under 35 U.S.C. 371 of international patent application number PCT/SG2023/050644 filed on Sep. 27, 2023, which designated the U.S., and which claimed priority to U.S. provisional patent application No. 63/491,732 filed on Mar. 22, 2023, which are incorporated herein by reference.

FIELD

Embodiments of the invention relate to integrated circuit (IC) modules having direct chip attachment, smart cards or devices which incorporate such IC modules, carrier tapes for fabricating such modules; and methods for fabricating such carrier tapes, IC modules, and smart cards or devices.

BACKGROUND

Dual interface smart cards incorporate an IC module which provides both direct contact and contactless interfaces (hereinafter "dual interface integrated circuit module"). While various arrangements of dual interface IC module and dual interface smart card, and methods of fabrication thereof exist, there is a need to provide choices that are useful in the art and address known issues with existing arrangements.

SUMMARY

According to a first aspect, an article of manufacture comprises:
- a non-conductive substrate having a front side and a rear side, and a plurality of through holes extending from the front side to the rear side;
- a smart card contact area arranged on the front side of the substrate and having a plurality of conductive pads which are mutually insulated and close front-side ends of the through holes;
- a plurality of through-hole solder pads and a plurality of conductive traces arranged on the rear side of the substrate, wherein the through-hole solder pads are arranged at rear-side ends of the through holes, wherein the conductive traces are conductively coupled to the through-hole solder pads respectively; and
- a solder mask at least partially overlaying the conductive traces.

In an embodiment of the first aspect, the article of manufacture further comprises: a first solder arranged in a first subset of the through holes and on a first subset of the through-hole solder pads, and configured to conductively couple a first subset of the conductive pads to a first subset of the conductive traces.

In an embodiment of the first aspect, the article of manufacture of the first embodiment further comprises: an integrated circuit (IC) chip conductively coupled to the first subset of the conductive traces by direct chip attachment, thereby conductively coupling the IC chip to the first subset of the conductive pads.

In an embodiment of the first aspect, the article of manufacture further comprises:
an underfill material interposed between the IC chip and the rear side of the substrate and/or an encapsulant provided on the IC chip,
wherein the rear-side ends of the through holes are substantially free of the underfill material, the solder mask and/or the encapsulant.

In an embodiment of the first aspect, the article of manufacture further comprises:
a second solder arranged in a second subset of the through holes and on a second subset of the through-hole solder pads, wherein the second subset of the solder pads and the second solder are co-operable to provide a plurality of antenna-connection pads.
wherein the IC chip is conductively coupled to the second subset of the through-hole solder pads through the second subset of the conductive traces, the article of manufacture further comprising:
an antenna conductively coupled to the antenna-connection pads, thereby conductively coupling the antenna to the IC chip.

In an embodiment of the first aspect, the article of manufacture further comprises:
a biometric circuitry conductively coupled to the IC chip; and/or
a light emitting diode (LED) circuitry, which includes at least one LED module and a second antenna conductively coupled thereto, wherein the second antenna is configured to be inductively coupled to a contactless reader to operate the at least one LED module.

In an embodiment of the first aspect, the article of manufacture further comprises:
surface-mount solder pads arranged on the rear side of the substrate and conductively coupled to the first subset of the through-hole solder pads through the first subset of the conductive traces; and
wherein the IC chip is arranged under the smart card contact area and conductively coupled to the surface-mount solder pads.

In an embodiment of the first aspect, the second subset of the through holes are non-diametrically opposed with respect to the IC chip.

In an embodiment of the first aspect, at least some of the conductive pads are arranged in an array of rows and columns, wherein the second subset of the through holes are arranged in different rows and columns.

In an embodiment of the first aspect, one of the second subset of the through holes is arranged at C6 pin position according to ISO 7816.

In an embodiment of the first aspect, the IC chip is arranged offset with respect to the smart card contact area.

In an embodiment of the first aspect, the substrate is dimensioned according to ID-1 size, half ID-1 size, or quarter ID-1 size according to ISO 7810.

In an embodiment of the first aspect, the substrate, the smart card contact area, the through-hole solder pads, the conductive traces, the solder mask, the first solder and the second solder are provided as a printed circuit board.

In an embodiment of the first aspect, the conductive traces include a module antenna at least partially surrounding the through-hole solder pads.

According to a second aspect, a smart card comprises:
a laminated core comprising a plurality of laminated layers, wherein one of the laminated layers comprises the article of manufacture of any described embodiment.

According to a third aspect, a method for fabricating an IC module comprises:
conductively coupling an integrated circuit (IC) chip to the first subset of the conductive traces of the article of manufacture of any described embodiment, thereby conductively coupling the IC chip to the contact pins; and providing an underfill material between the IC chip and the substrate and providing an encapsulant on the IC chip, including having the rear-side ends of the through holes substantially free of the underfill material, the solder mask and/or the encapsulant.

According to a fourth aspect, a method for fabricating a smart card comprises:

conductively coupling an antenna to the antenna-connection pads of any described embodiment, thereby conductively coupling the antenna to the IC chip.

According to a fifth aspect, a method for fabricating an article of manufacture comprises:

perforating a non-conductive substrate to produce through holes extending from a front side to a rear side of the substrate;

plating a smart card contact area on the front side of the substrate, the smart card contact area having a plurality of conductive pads which are mutually insulated and close front-side ends of the through holes;

plating through-hole solder pads on the rear side of the substrate, wherein the through-hole solder pads are arranged at rear-end sides of the through holes;

plating a plurality of conductive traces on the rear side of the substrate, wherein the conductive traces are conductively coupled to the through-hole solder pads; and applying a solder mask at least partially overlaying the conductive traces.

In an embodiment of the fifth aspect, the method further comprises:

depositing a first solder in a first subset of the through holes and on the first subset of the through-hole solder pads, wherein the first solder is configured to conductively couple a first subset of the conductive pads to a first subset of the conductive traces through the first subset of the through-hole solder pads.

In an embodiment of the fifth aspect, the method further comprises:

depositing a second solder in a second subset of the through holes and on the second subset of the solder pads, thereby allowing the second subset of the through-hole solder pads and the second solder to co-operably provide a plurality of antenna-connection pads;

depositing a third solder on a plurality of surface-mount solder pads at ends of the conductive traces which are distal from the through-hole pads;

arranging an integrated circuit (IC) chip on the rear side of the substrate; and reflowing at least the first solder, the second solder, and the third solder, thereby conductively coupling the IC chip to the first subset of conductive pads through the first subset of the conductive traces, and conductively coupling the IC chip to the second subset of the through-hole solder pads.

In an embodiment of the fifth aspect, the method further comprises:

providing an underfill material interposed between the IC chip and the substrate;

providing an encapsulant on the IC chip;

maintaining the rear-side ends of the through holes substantially free of the underfill material, the solder mask and/or the encapsulant.

In an embodiment of the fifth aspect, the IC chip is conductively coupled to the second subset of the solder pads through the second subset of the conductive traces, the method further comprising: conductively coupling an antenna to the antenna-connection pads, thereby conductively coupling the antenna to the IC chip.

According to a sixth aspect, an integrated circuit (IC) module for a smart card with both contact and contactless interfaces is provided. The IC module comprises:

a non-conductive substrate having a plurality of through holes extending from a front side to a rear side of the substrate, wherein the through holes include a first subset, a second subset, and a third subset of the through holes;

a smart card contact area arranged on the front side of the substrate and having a plurality of conductive pads which include a first subset of the conductive pads arranged to respectively close the first subset of the through holes respectively, and a second subset of the conductive pads arranged to close the second subset and the third subset of the through holes;

an IC chip arranged on the rear side of the substrate;

a plurality of conductive elements traversing the first subset and the third subset of the through holes and conductively coupling the first subset and the second subset of the conductive pads to the IC chip; and an encapsulant deposited in the first subset and the third subset of the through holes, wherein the encapsulant is further deposited on the IC chip and the conductive elements, wherein the second subset of the through holes are separated from the third set of the through holes by the substrate, wherein the second subset of the through holes are non-diametrically opposed with respect to the IC chip.

In an embodiment of the sixth aspect, at least some of the conductive pads are arranged in an array of rows and columns, wherein the second subset of the through holes are arranged in different rows and columns.

In an embodiment of the sixth aspect, one of the second subset of the conductive pads includes an area which traverses more than one row and column.

In an embodiment of the sixth aspect, the encapsulant is further deposited in at least one of the second subset of the through holes.

In an embodiment of the sixth aspect, at least one of the second subset of the through holes is adapted to receive the encapsulant.

In an embodiment of the sixth aspect, one of the second subset of the conductive pads is arranged at C6 pin position according to ISO 7816.

According to a seventh aspect, a smart card with both contact and contactless interfaces is provided. The smart card comprises:

a card body having an opening and an antenna; and the integrated circuit (IC) module of any described embodiment, which is disposed in the opening;

a pair of antenna-connecting elements arranged in the second subset of the through holes and conductively coupling the antenna to the second subset of the conductive pads.

In an embodiment of the seventh aspect, each of the antenna-connecting elements includes a rigid conductive or solder bump, a conductive disc, a flexible conductive bump comprising an electrically conductive adhesive, or a portion of the antenna.

In an embodiment of the seventh aspect, each of the second subset of the through holes is adapted to receive at most one conductive element.

According to an eighth aspect, a single-side plated integrated circuit (IC) carrier tape adapted for use in smart card with both contact and contactless interfaces is provided. The IC carrier tape comprises:

a non-conductive substrate having a plurality of through holes extending from the front side to the rear side of the substrate, wherein the rear side of the substrate is adapted to be arranged with an IC chip thereon, wherein the through holes include a first subset, a second subset, and a third subset of the through holes;

a smart card contact area arranged on the front side of the substrate and having plurality of conductive pads which include a first subset of the conductive pads arranged to respectively close the first subset of the through holes, and the second subset of the conductive pads arranged to close the second subset and the third subset of the through holes;

wherein the first subset and the third subset of the through holes are adapted to receive a plurality of conductive elements to conductively couple the first subset and the second subset of the conductive pads to the IC chip; and wherein the first subset and the third subset of the through holes, the IC chip, and the conductive elements are adapted to receive an encapsulant, wherein the second subset of the through holes are separated from the third set of the through holes by the substrate, wherein the second subset of the through holes are non-diametrically opposed with respect to the IC chip.

In an embodiment of the eighth aspect, the conductive pads are arranged in an array of rows and columns, wherein the second subset of the through holes are provided at some of the conductive pads which are arranged in different rows and columns.

In an embodiment of the eighth aspect, an area of one of the second subset of the conductive pads traverses more than one row and column.

In an embodiment of the eighth aspect, at least one of the second subset of the through holes is adapted to receive the encapsulant.

In an embodiment of the eighth aspect, one of the second subset of the conductive pads is arranged at a C6 pin position according to ISO 7816.

BRIEF DESCRIPTION OF DRAWINGS

FIG. 1E provides another rear view of an IC module;

FIG. 1F provides a cross-sectional view taken along line 1F-1F;

FIG. 1G shows a rear view of a carrier tape having a module antenna according to an embodiment;

FIG. 2A shows a card structure having a laminated core arrangement in which only the IC module is shown while other components are omitted to avoid obscurity;

FIG. 2B shows a circuit board inlay which is removed from the card structure according to an embodiment;

FIG. 2C shows a side view of the circuit board inlay of FIG. 2B;

FIGS. 4A and 4B show PCB substrates provided in half ID-1 size and quarter ID-1 size, respectively;

FIG. 5A shows a front view of a carrier tape or IC module according to an embodiment;

FIG. 5B shows a rear view of the carrier tape of FIG. 5A;

FIG. 5C shows a rear view of the IC module of FIG. 5A;

FIG. 6A provides a flow sequence for fabricating IC modules;

FIG. 6B provides a flow sequence for fabricating smart cards;

DETAILED DESCRIPTION

Figures 1A, 1B, 1C, 1D:
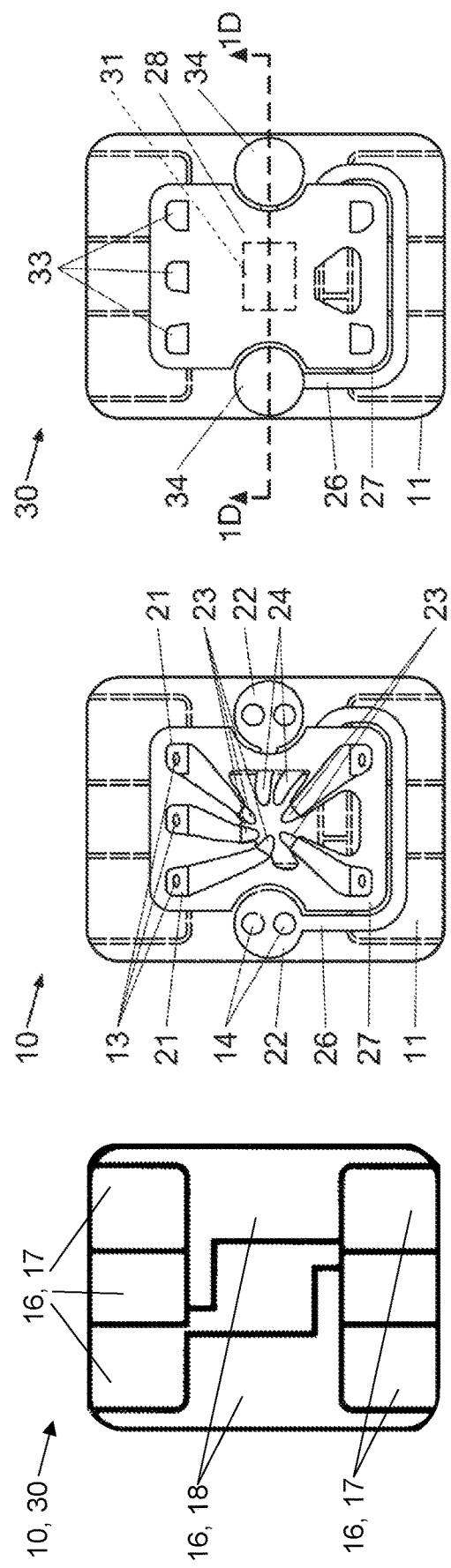
FIG. 1A shows a front view of a carrier tape or IC module according to an embodiment.
FIG. 1B shows a rear view of the carrier tape of FIG. 1A.
FIG. 1C shows a rear view of the IC module of FIG. 1A.
FIG. 1D provides a cross-sectional view taken along line 1D-1D.

In the following description, numerous specific details are set forth in order to provide a thorough understanding of various illustrative embodiments of the invention. It will be understood, however, to one skilled in the art, that embodiments of the invention may be practiced without some or all of these specific details. It is understood that the terminology used herein is for the purpose of describing particular embodiments only, and is not intended to limit the scope of the invention. In the drawings, like reference labels or numerals refer to same or similar functionalities or features throughout the several views.

Embodiments described in the context of one of the devices or methods are analogously valid for the other devices or methods. Similarly, embodiments described in the context of a device are analogously valid for a method, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

It should be understood that the articles "a", "an" and "the" as used with regard to a feature or element include a reference to one or more of the features or elements. The term "and/or" includes any and all combinations of one or more of the associated feature or element. The terms "comprising," "including," and "having" are intended to be open-ended and mean that there may be additional features or elements other than the listed ones. Identifiers such as "first", "second" and "third" are used merely as labels, and are not intended to impose numerical requirements on their objects, nor construed in a manner imposing any relative position or time sequence between limitations. Furthermore, terms such as "front", "rear", "top", "bottom", "side", "under", "over", "on", "onto" used herein are merely for ease of description and may refer to the orientation of the features or elements as shown in the figures. It should be understood that any orientation of the features described herein is within the scope of the invention.

The phrase "conductively coupled" and related phrase include a reference to transfer of electrical energy or current between elements by physical contact or electrically conductive medium. The phrase "inductively coupled" and related phrase include a reference to transfer of electrical energy or current between elements by electromagnetic induction or a common changing magnetic field, i.e., without physical contact between the elements.

The phrase "printed circuit board" may refer to a non-conductive board base having conductive traces and/or circuitry arranged therein and/or thereon to provide electrical current paths. Electronic components are soldered to the board, particularly onto conductive pads which are connected to the board circuitry.

According to some aspects of the invention, articles of manufacture, i.e., carrier tapes for IC modules are provided. FIGS. 1A and 1B provide a non-limiting embodiment of a carrier tape which is described as follows.

FIGS. 1A and 1B show a front view and a rear view, respectively, of a carrier tape 10 which may be provided as a printed circuit board (PCB).

The carrier tape 10 includes a non-conductive substrate 11 having a front or contact side (may be referred to as first side) and a rear or bonding side (may be referred to as second side), a plurality of through holes 13, 14 extending through the substrate 11, e.g., from the front side to the rear side, and conductive layers, e.g., conductive pads, conductive traces and solder pads, provided on the front and the rear sides such as by plating and/or etching.

The through holes 13, 14 include a first subset 13 and a second subset 14 of the through holes. Each through hole 13, 14 has opposed openings or ends, e.g., front-side end and rear-side end which are respectively located at front side and rear side of the non-conductive substrate 11. The through holes 13, 14 may be provided with different dimensions and/or shapes. In some non-limiting examples, the second subset 14 of the through holes have larger dimensions or areas than the first subset 13 of the through holes. For example, diameter of the first subset 13 of the through holes may be about 0.6 mm to about 0.9 mm while diameter of the second subset 14 of the through holes may be about 2.0 mm. However, in other non-limiting examples, the second subset 14 of the through holes may have similar dimensions or areas relative to the first subset 13 of the through holes. In yet other non-limiting examples, some of the through holes may have similar dimensions or areas while some others of the through holes may have different dimensions or areas. The first and/or the second subset of the through holes 13, 14 may take on one or more shapes, e.g., regular shapes, irregular shapes. Non-limiting examples include circle, rounded rectangle, L-shape, ellipse, polygon, combination of interconnecting or overlapping regular shapes. Shapes of the first and/or the second subset of the through holes 13, 14 may be similar and/or distinct.

The first subset 13 of the through holes may be referred to as chip-bonding holes configured to receive a conductive element, e.g., solder, which is configured to conductively couple to an IC chip 31. The second subset 14 of the through holes may be referred to as heat transfer holes configured to accommodate a heat transfer medium, e.g., solder.

A smart card contact area 16 is arranged on the front side of the substrate 11 and closes up front-side ends of the through holes 13, 14. The smart card contact area 16 includes a plurality of conductive pads 17, 18 wherein at least some are conductively insulated from one another. The conductive pads 17, 18, may be sized, shaped and arranged in compliance with International Organization for Standardization (ISO) standards for the manufacture of smart cards. Dimensions of the smart card contact area 16 may be about 85.60 mm×53.98 mm according to ISO 7810 standard. The conductive pads 17, 18 may be made of metal, e.g., copper, nickel. The conductive pads 17, 18 include a first subset 17 and a second subset 18 of the conductive pads. Each conductive pad 17 of the first subset 17 includes an external side and an internal side so that in operation the external side makes electrical contact with a contact-type smart card reader or electronic terminal to allow signal transmission between the card reader and an IC chip electrically connected to the smart card contact area 16, while the internal side is accessible through a corresponding through hole to allow a conductive element, e.g. solder, to be disposed therein to establish electrical connection with the conductive pad. However, each conductive pad 18 of the second subset 18 of the conductive pads may not make electrical contact with contact-type smart card reader or electronic terminal.

For example, the first subset 17 of the conductive pads may be arranged according to C1, C2, C3, C5, C6, C7 pin positions of ISO 7816, hence they may be referred to as contact pads. The second subset 18 of the conductive pads may be arranged between C1 and C5, between C3 and C7, and/or other locations. Alternatively, in some other embodiments (not shown), the second subset 18 of the conductive pads may be arranged according to C4 and C8 pin position of ISO 7816. The second subset 18 of the conductive pads may be referred to as heat transfer pads.

On the rear side of the non-conductive substrate 11, a plurality of solder pads 21, 22, 23, 24, a plurality of conductive traces 25, 26, and solder mask ink 27 are arranged thereon. The solder pads 21, 22, 23, 24 include through-hole solder pads 21, 22, e.g., seven as shown in FIG. 1B, and surface-mount solder pads 23, 24, e.g., seven as shown in FIG. 1B. Particularly, the through-hole solder pads 21, 22 are arranged at, e.g., adjacent to, rear-side ends of the through holes 13, 14, respectively. The through-hole solder pads 21, 22 include a first subset 21 of the through-hole solder pads which are arranged at the rear-side ends of the first subset 13 of the through holes, and a second subset 22 of the through-hole solder pads which are arranged at the rear-side ends of the second subset 14 of the through holes. The surface-mount solder pads 23, 24 include a first subset 23 and a second subset 24 of the surface-mount solder pads.

Conductive traces 25, 26 conductively couple the through-hole solder pads 21, 22 to the surface-mount solder pads 23, 24, respectively. The conductive traces 25, 26 include a first subset of the conductive traces 25 which are conductively coupled between the first subset 21 of the through-hole solder pads and the first subset 23 of the surface-mount solder pads, and a second subset 26 of the conductive traces which are conductively coupled between the second subset 22 of the through-hole solder pads and the second subset 24 of the surface-mount solder pads.

Solder mask ink 27 is deposited on the rear side of the substrate 11 to define solder-free areas and/or solder areas. In particular, the solder mask ink 27 may be deposited on or overlay at least partially the conductive traces 25, 26 and/or at least partially the solder pads 21, 22, 23, 24. Hence, the solder pads 21, 22, 23, 24 are at least partially or mostly free of solder mask ink.

In preparation for fabricating an IC module 30, the carrier tape 10 may be provided with a first solder 33, a second solder 34, and a third solder 35.

The first solder 33 may be arranged, e.g., deposited, in the first subset 13 of the through holes and on the first subset 21 of the through-hole solder pads, and configured to, after reflow, conductively couple the first subset 17 of the conductive pads to the first subset 25 of the conductive traces.

The second solder 34 may be arranged, e.g. deposited, in the second subset 14 of the through holes and on the second subset 22 of the through-hole solder pads. The second subset 22 of the solder pads and the second solder 34 are co-operable to provide a plurality of antenna-connection pads (collectively by 22, 34).

The third solder may be arranged, e.g. deposited, on the surface-mount solder pads 23, 24.

According to some aspects of the invention, articles of manufacture, e.g., IC modules having direct chip attachment are provided. FIGS. 1C to 1F provide a non-limiting embodiment of an IC module 30 fabricated on the carrier tape 10 of FIGS. 1A and 1B.

FIGS. 1A and 1C show a front view and a rear view, respectively, of an IC module 30. FIG. 1D provides a cross-sectional view taken along line 1D-1D of FIG. 1C. FIG. 1E shows another rear view of an IC module 30. FIG. 1F provides a cross-sectional view taken along line 1F-1F of FIG. 1E.

On the rear side of the carrier tape 10, an IC chip 31 is mounted to the carrier tape 10 by direct chip attachment. The IC chip 31 is conductively coupled to the first subset 17 of the conductive pads, e.g., C1, C2, C3, C5 and C7. In particular, the IC chip 31 is conductively coupled to the first subset 23 of the surface-mount solder pads through the third reflowed solder 35 thereon, the first subset 23 of the surface-mount solder pads are conductively coupled to the first subset 26 of the conductive traces which are conductively coupled to the first subset 21 of through-hole solder pads which are in turn conductively coupled to the first subset 17 of the conductive pads through the reflowed first solder 33 arranged in the first subset 13 of through holes. In other words, an electrical current path is provided between the IC chip 31 and each of the first subset 17 of the conductive pads so that when the smart card conductive area 16 is arranged in electrical contact with the reader, the IC module 30 may be operated, e.g., perform card transactions.

Additionally, the IC chip 31 is conductively coupled to the second subset 24 of the surface-mount solder pads through the third reflowed solder 35 thereon, the second subset 24 of the surface-mount solder pads are conductively coupled to the second subset 18 of the conductive traces which are conductively coupled to the second subset 22 of through-hole solder pads.

The antenna-connection pads 22, 34 are opposed to the second subset 18 of the conductive pads (heat transfer pads). The antenna-connection pads 22, 34 may be larger than other solder pads to provide a sizeable area to hold sufficient solder for an antenna to connect with. At each antenna-connection pad, the reflowed second solder 34 in the second subset 14 of the through holes may be arranged in contact with a heat transfer pad 18 located on the front side of the substrate 11. The function of this heat transfer pad 18 is to improve heat transfer during a reflow process of connecting the antenna to the antenna-connection pad 22, 34, but is not meant to provide an electrical current path to the IC chip 31 to the antenna 41.

In the IC module 30, an underfill material 37 may be provided in a gap between a first side of the IC chip 31 and the rear side of the carrier tape 10. The underfill material 37 is to prevent chip damage due to mechanical stress. An encapsulant 28 may be deposited on the IC chip 31, e.g., on a second side of the IC chip 31 which is opposed to its first side. The area covered by the underfill material 37, solder mask 27, and/or encapsulant 28 may not extend to or overlay the through holes 13, 14, their reflowed solder 33, 34, or the through-hole solder pads 21, 22. In other words, the through holes 13, 14, their reflowed solder 33, 34, the through-hole solder pads 21, 22 are substantially free of underfill material 37, solder mask 27 and/or encapsulant 28. It is to be appreciated that in some non-limiting examples, the underfill material 37, the solder mask 27, and/or the encapsulant 28 may not be deposited on the IC chip 31.

According to some aspects of the invention, IC modules 30 are incorporated into an article of manufacture, e.g., smart cards or devices 40. Such IC modules may be provided by the above-described IC modules 30 or other IC modules not described herein. A non-limiting embodiment of a smart card or device 40 will be described with reference to the IC module 30 of FIGS. 1C to 1F.

In a smart card or device 40, each antenna-connection pad 22, 34 of the IC module 30 is conductively coupled to an antenna 41, e.g., card antenna, metal coil, through an antenna-connecting element, e.g. reflowed second solder 22, provided at the antenna-connection pad 22, 34. Upon such conductively coupling, the antenna 41 is conductively coupled to the IC chip 31 through the antenna-connection pads 22, 34 and the second subset 26 of the conductive traces (see cross-section view along line 1F-1F). In particular, the IC chip 31 is conductively coupled to the second subset 24 of the surface-mount solder pads through the reflowed third solder 35 thereon, the second subset 24 of the surface-mount solder pads are conductively coupled to the second subset 26 of the conductive traces which are conductively coupled to the antenna-connection pads 22, 34. In other words, an electrical current path is provided between the antenna 41 and the IC chip 31, wherein such path excludes the second subset 18 of the conductive pads (heat transfer pads). Although there may be contact between the reflowed second solder 34, which is arranged in the second subset 14 of the through holes, and the second subset 18 of the conductive pads (heat transfer pads) due to the above-described heat transfer function, there is essentially no electrical current between the antenna 41 and the second subset 18 of the conductive pads (heat transfer pads) due to differences in electrical conductivity of the second subset 26 of the conductive traces and the reflowed second solder 34 in the second subset of the through holes 14, and also due to an open circuit at the second subset 18 of the conductive pads (heat transfer pads). Accordingly, an electric current to be induced in the antenna 41 is expected to flow in the following sequence: from the antenna 41 to the antenna-connection pads 22, 34, followed by the second subset 26 of the conductive traces, followed by the corresponding one of the second subset 24 of the surface-mount solder pads, and to the IC chip 31.

It is to be appreciated that the above-described carrier tape and IC module may be modified, such as to include an antenna. FIG. 1G provides a non-limiting embodiment of a carrier tape 101 which is largely similar to the example of FIGS. 1B to 1F, however, the two antenna-connection pads and at least part of their associate conductive traces are replaced by an antenna 81 (hereinafter "module antenna"). The module antenna 81 may be formed similarly to the conductive traces. The module antenna 81 may fully surround (shown) or partially surround (not shown) the through-hole solder pads 21, 22, surface-mount solder pads 23, 24, and/or conductive traces 25, 26 interconnecting the through-hole solder pads 21, 22 and the surface-mount solder pads 23, 24. The module antenna 81 includes first ends having surface-mount solder pads 24 which are to conductively couple to an IC chip (not shown) when the IC chip is appropriately placed on the carrier tape 101 and reflowed to produce an IC module. The module antenna 81 includes second ends having through-hole solder pads 22, wherein the second ends 22 are conductively coupled to provide the module antenna as an antenna loop. This conductively coupling may be provided by conductive traces (not shown) arranged under the rear side of the substrate 11 or embedded in the substrate 11. Solder mask (not shown) may be deposited on the rear side of the substrate 11 to at least partially overlay conductive traces 25, 26 and/or at least partially overlay the through-hole solder pads 21, 22 and the surface mount solder pads 23. It is to be appreciated that the solder mask may be similar to the solder mask 27 provided in relation to the embodiments of FIG. 1B to 1F.

Non-limiting embodiments of smart card or device 40 will be described with reference to FIGS. 2A to 2G.

FIG. 2A shows a card structure having a laminated core arrangement 40. The laminated core 40 may comprise a plurality of stacked laminated layers which may comprise a top overlay 1, a first substrate 2, e.g., polyvinyl chloride (PVC) material, a circuit board inlay 3 or second substrate, e.g. PCB, a third substrate 4, e.g., PVC material, a fourth substrate 5, e.g., polyethylene terephthalate glycol (PETG) material, a fifth substrate 6, e.g., PVC material, and a bottom overlay 7. The laminated core 40 comprises at least one IC module 31 (shown) which is accommodated in a cavity of the laminated core, and other components (not shown).

It is to be appreciated that the card structure may comprise fewer or more layers, or the above-described layers may be interchanged or modified.

FIG. 2B shows the circuit board inlay 3 or second substrate, e.g., PCB as described above, which is removed from the card structure, while FIG. 2C shows a schematic side view of FIG. 2B. The PCB 3 includes a card circuitry 42, which is arranged on the PCB substrate 11, for performing card transaction and data communication operation. The card circuitry 42 includes a conductor pattern 43, e.g., smart card contact area, conductive traces, which may be formed by dry etching a metallisation layer, e.g., aluminium, plated on the substrate 11. The card circuitry 42 includes at least one IC chip 31, the smart card contact area 16, a plurality of conductive traces conductively coupling the smart card contact area 16 to the IC chip 31, an antenna 41 (or a first antenna) conductively coupled to the IC chip 31. As the IC chip 31 is arranged under the smart card contact 16 as illustrated in FIGS. 1D and 1F, it is not shown in FIGS. 2B and 2C. The first antenna 41 may be provided on/under the substrate 11 or on/under other layers and/or the first antenna 41 may be provided in a different form factor and/or location. The card circuitry 42 may further include at least one central processing unit (CPU) chip 43 and capacitors 44 as shown in FIGS. 2B and 2C for operation of the card circuitry and a biometric circuitry.

At least some of the conductive pads 17 of the smart card contact area 16 are to provide contact-based signal transmission with a contact-based card reader while the first antenna 41 is to provide contact-free signal transmission to a contactless card reader. The smart card contact area 16 may have dimensions and layout in accordance with ISO or other industry standards. The smart card contact area 16 may be provided as a regular shape, e.g., rectangle, square; or a modified regular shape, e.g. round rectangle, rounded square; or an irregular or customised shape, e.g. logo, trade mark, sign, symbol, character, as long as pinout positions of the smart card contact area 16 conform to ISO or other industry standards. Irregular or customised shape may be a pattern comprising regular and/or modified regular shapes, a representation of known or imaginary object.

The PCB 3 may include a light emitting diode (LED) circuitry 52, which may be at least partially formed on the front or rear side of the PCB substrate 11 and configured to light up a LED module 53 such as when the card 40 is brought within a prescribed proximity of a contactless card reader to implement contact-free signal transmission.

The LED circuitry 52 may include an inductive circuitry provided or formed on the front or rear side of the PCB substrate 11. The inductive circuitry may include a conductor pattern, e.g., conductive traces, antenna, which may be formed by dry etching a metallisation layer plated on the PCB substrate 11. The inductive circuitry includes at least one LED module 53 and a second antenna 51, which may be a metal or inductor coil, conductively coupled thereto. In operation, when the smart card 40 is brought within a prescribed proximity of a contactless card reader to implement contact-free signal transmission, the second antenna 51 inductively couples with an oscillating magnetic field of the card reader and possibly with the first antenna 41 of card circuitry 42. This inductive coupling produces an electric current in the inductive circuitry to operate the LED module 53. At the same time, the first antenna 41 inductively couples with an oscillating magnetic field of the card reader to produce an electric current in the card circuitry 42 to operate the IC chip 31, and any other components included in the card circuitry 42.

The PCB substrate 11 may include a biometric circuitry 62 which may be at least partially provided or formed on the front or rear side of the PCB substrate 11 and conductively coupled to the IC chip 31 through conductive traces provided or formed on the PCB substrate 11, and configured to detect, e.g., read or receive, biometric data and provide the detected biometric data to the card reader and/or the IC chip of the card circuitry 42. The biometric circuitry 62 includes a conductor pattern e.g., conductive traces, which may be formed on a PCB substrate 11 by dry etching a metallisation layer, e.g. aluminium, plated on the PCB substrate 11. The biometric circuitry 62 includes at least one biometric IC chip 63, e.g., fingerprint sensor controller chip, a biometric data sensor 64, e.g., fingerprint sensor, conductively coupled to the biometric IC chip 63, a plurality of conductive traces having at least one conductive trace conductively coupling the biometric sensor to the biometric IC chip, and optionally at least one capacitor.

Referring to FIGS. 2A and 3A to 3C, the overlay 1 and the first substrate 2 may be provided with at least one opening to accommodate the smart card contact area 16, and/or biometric sensor 64. In particular, when the stacked layers are laminated, the smart card contact area 16 and/or biometric sensor 64 are projected through the opening(s). The smart card contact area 16 and/or biometric sensor 64 as well as a portion of the PCB substrate 11 may substantially fill the opening in the overlay 1 and the first substrate 2. The smart card contact area 16 and/or biometric sensor 64 may be substantially flush with the overlay 1, i.e., outer surface of the laminated core 40. The first substrate 2 and/or other substrate(s) in the laminated core 40 may be provided with at least one opening or cavity to accommodate the LED module 53.

In FIGS. 2B and 2C, the PCB 3 includes a card circuitry 43, a LED circuitry 52, and a biometric circuitry 62, and hence the PCB substrate 11 may be substantially larger than the smart card contact area 10 or approximately the size of the final smart card or device, e.g., as illustrated in FIGS. 3A to 3C and 4A to 4B. In some other examples, the smart card may include a card circuitry and either LED circuitry or biometric circuitry. In yet other examples, the PCB 3 may include a card circuitry as illustrated in FIGS. 2D and 2E.

In FIGS. 2B and 20, the card circuitry 42, first antenna 41, LED circuitry 52, and/or biometric circuitry 62 are provided on the same side of the same PCB substrate 11. In some other examples, at least one of them or part of any circuitry may be provided on a different side of the PCB substrate 11 or on at least one different substrate.

In FIGS. 2B to 2C, the IC chips 31, 43, 63 are not provided with encapsulant. In some other examples, at least one of the IC chips may be provided with encapsulant.

In FIGS. 2B to 2C, the PCB 3 includes multiple IC chips. In some other examples, a PCB 3 may comprise one or more IC chips.

In FIGS. 2B to 2C, the IC chips 31, 43, 63 are provided on the same side of the same PCB substrate 11. In some other examples, at least one of the IC chips may be provided on a different side of the PCB substrate 11 or on at least one different substrate.

In FIGS. 2B to 2C, the first antenna 41 is provided substantially along a perimeter of the smart card or device and encloses the remaining circuitry. In some other examples, the first antenna 41 may be provided in other dimensions or form factors.

In FIGS. 2B to 2D, the IC chip 31 is provided on the rear side of the smart card contact area 16, i.e., directly under the smart card contact area 16. In some other embodiments, the IC chip 31 may be arranged offset with respect to the smart card contact area 16, as illustrated in FIG. 2E. In FIG. 2E, the IC chip 31 is not arranged directly at or on the rear side of the smart card contact area 16. Instead, the IC chip 31 is spaced apart from and has no overlap with the smart card contact area 16. In particular, the IC chip 31 may be directly attached to solder pads which are also spaced apart and non-overlapping with the smart card contact area 16; the solder pads are in turn conductively coupled to the smart card contact area 16 via conductive traces provided on the PCB substrate 11, wherein the conductive traces are partially directly under the smart card contact area 16 and partially offset relative to the smart card contact area 16. The offset arrangement of the smart card contact area 16 with respect to the IC chip 31 provides a dis-aligned and non-overlapping relationship. In other words, in FIG. 2E, areas on the PCB substrate 11 respectively defined by the smart card contact area 16 and by the IC chip 31 are dis-aligned and non-overlapping along a direction which is transverse to a planar surface defined by edges of the PCB substrate 11. This offset arrangement of the smart card contact area 16 with respect to the IC chip 31 allows the smart card contact area 16 to take on any shape including geometric and non-geometric shapes, and reduces risk of damage to the IC chip 31 even with repeated use from interfacing the smart card contact area 16 with a contact-type reader.

The embodiment of FIG. 2E, having conductive traces formed on the PCB substrate 11 conductively couple the IC chip 31 to the antenna 41, may differ from embodiment of FIGS. 1B to 1F in that FIG. 2E may not include antenna-connection pads under the smart card contact area 16. In other words, FIG. 2E may not include the second subset of the through holes, the second subset of the through-hole solder pads, the second subset of the conductive traces, and the second subset of the surface-mount solder pads. In the embodiment of FIG. 2E, the PCB 3 includes a card circuitry. In some other examples, the PCB 3 may further include a LED and/or biometric circuitry.

Figure 2F:
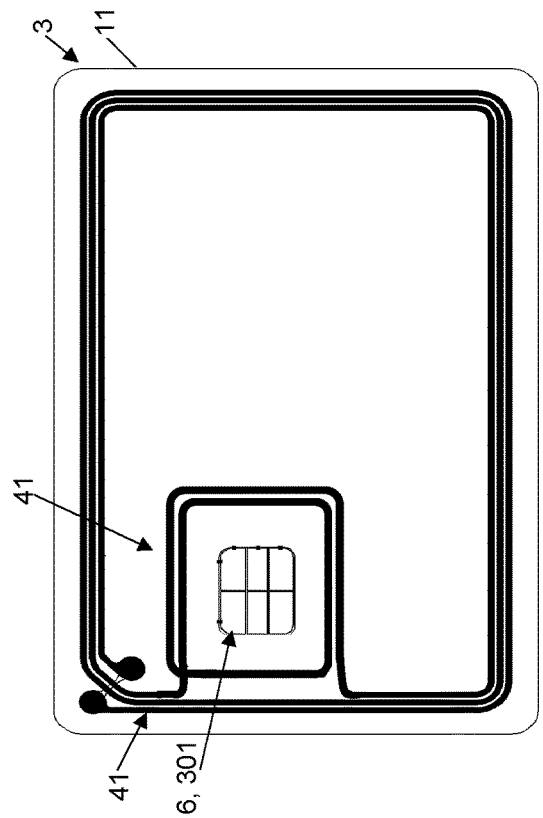
FIG. 2F shows a circuit board inlay which is removed from the card structure according to another embodiment.
Figure 2G:
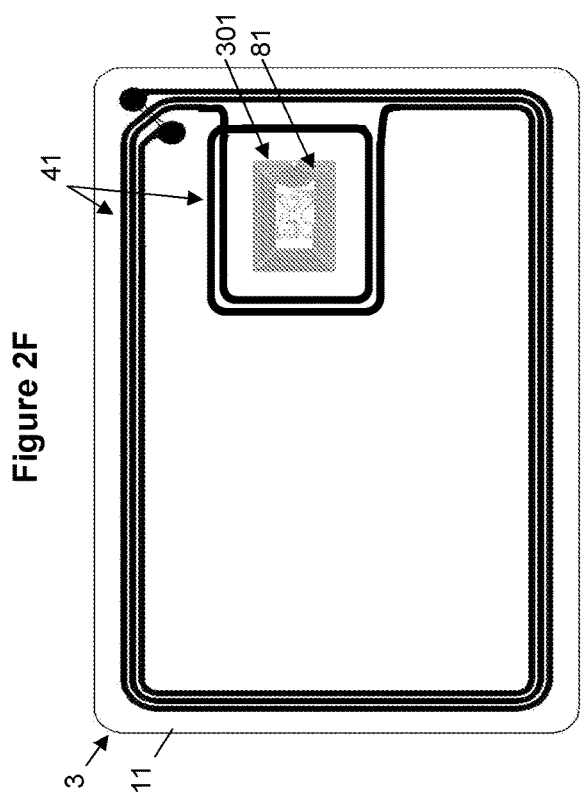
FIG. 2G shows a see-through rear view of the circuit board inlay of FIG. 2F.
Figure 2D:
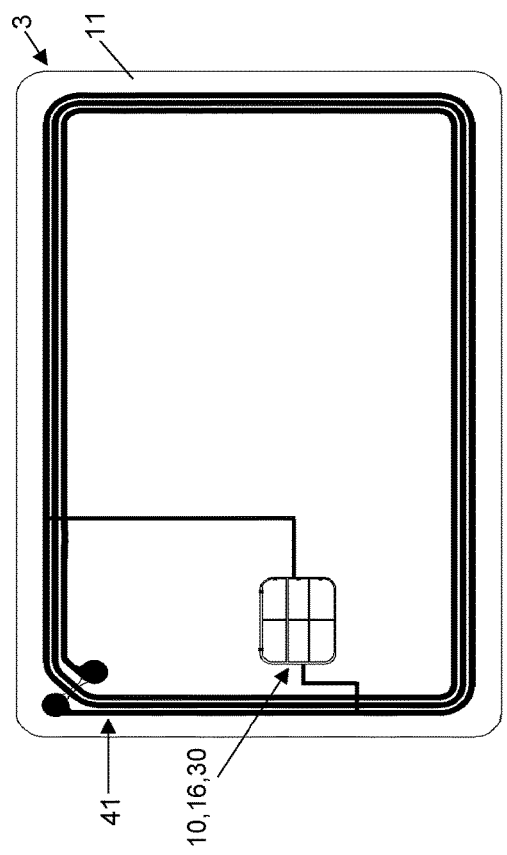
FIG. 2D shows a circuit board inlay which is removed from the card structure according to another embodiment.
Figure 2E:
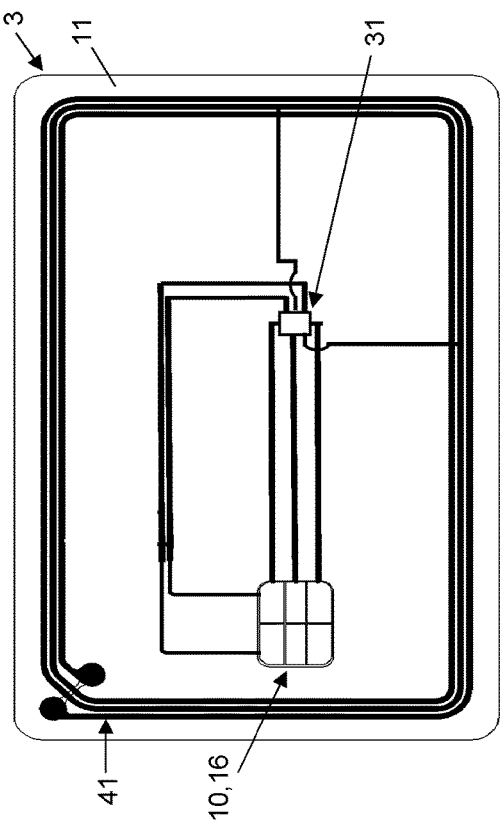
FIG. 2E shows a circuit board inlay which is removed from the card structure according to another embodiment.

FIG. 2F provides a PCB 3 which is largely similar to FIG. 2D, however, the IC module 301 of FIG. 2F incorporates the carrier tape 101 of FIG. 1G and is configured to inductively couple to a card antenna 41 during operation, i.e., the card antenna 41 is arranged in inductive proximity to the module antenna 81. In other words, in a smart card or device incorporating the PCB 3 of FIG. 2F, the module antenna 81 is not conductively or physically coupled to the card antenna 41. In operation, when the smart card is brought within a prescribed proximity of a contactless card reader to implement contact-free signal transmission, the module antenna 81 inductively couples with an oscillating magnetic field of the card reader and with the card antenna 41. This inductive coupling produces an electric current to operate an IC chip of the IC module 301. While FIG. 2F shows a front view of a PCB 3, FIG. 2G shows a see-through rear view of the PCB 3 of FIG. 2F.

Figure 3C:
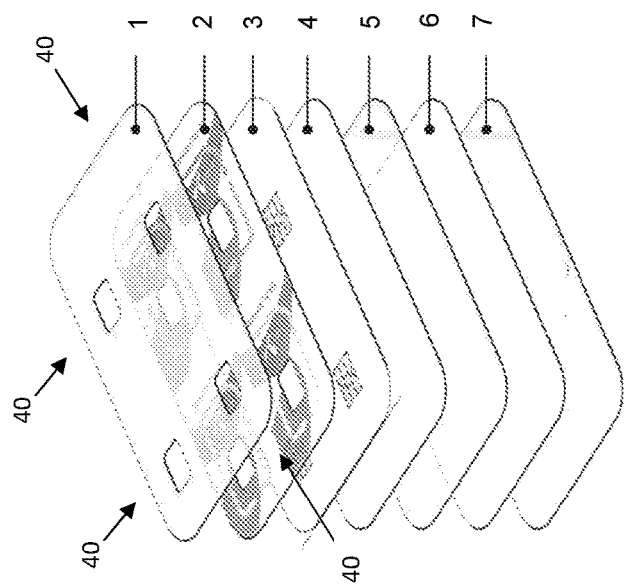
FIG. 3C shows an example of an exploded view of smart cards provided as quarter ID-1 size.
Figure 3A:
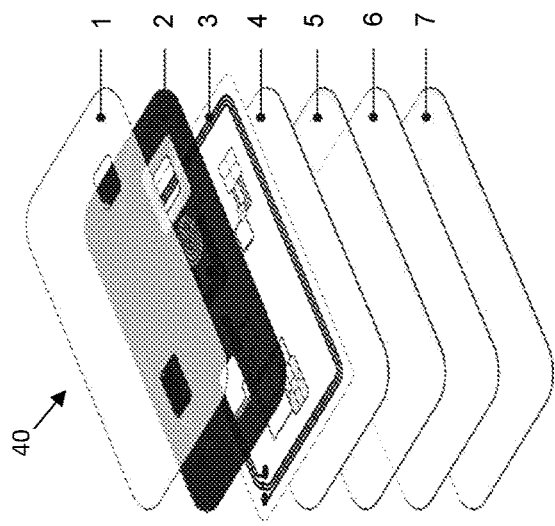
FIG. 3A shows an example of an exploded view of a smart card provided as ID-1 size.

FIG. 3A shows an example of a smart card provided as ID-1 size, e.g., 85.60 mm×53.98 mm according to ISO 7810 standard, or thereabout.

Figure 3B:
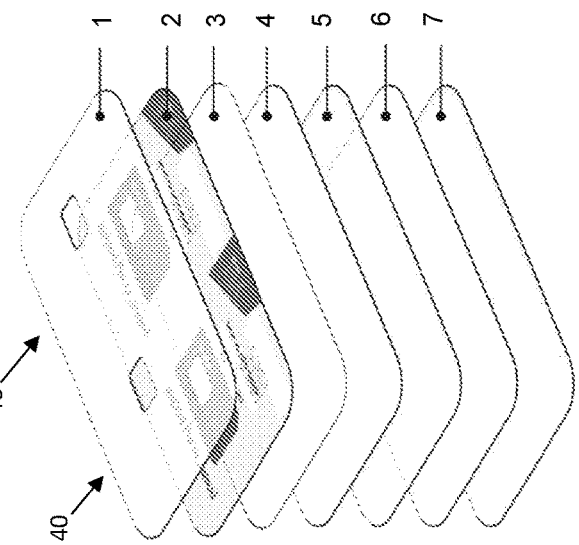
FIG. 3B shows an example of an exploded view of smart cards provided as half ID-1 size.

FIG. 3B shows an example of a smart card provided as half ID-1 size. Accordingly, an ID-1 size may comprise two smart cards.

FIG. 3C shows an example of a smart card provided as quarter ID-1 size. Accordingly, an ID-1 size may comprise four smart cards.

Accordingly, the PCB substrate 11 of examples shown in FIGS. 3A to 3C may be dimensioned according to ID-1 size, half ID-1 size, or quarter ID-1 size.

Other dimensions or form factors of the smart card are possible. For example, a smart card or device may be provided as in plug-in subscriber identity module (SIM) device, SIM card.

It is to be appreciated that the above-described smart card or devices may be provided or incorporated in various applications including but not limited to, banking, financial, payment, identification, health, telecommunications, communications, storage.

FIGS. 4A and 4B show a large sheet having multiple PCBs 3 in half ID-1 size and quarter ID-1 size, respectively. The multiple PCBs 3 may provide the circuit board inlays 3 or second substrates of FIG. 2E which are to be stacked between other layers, laminated to provide multiple laminated cores, and diced to provide multiple smart cards or devices.

In some embodiments, carrier tape and IC modules having antenna-connection pads, which are non-diametrically opposed with respect to the IC chip or on adjacent sides of the IC chip or smart card contact area, may be provided.

FIGS. 5A to 5C provide a non-limiting embodiment which is largely similar to the example of FIGS. 1B to 1F, however, one of the antenna-connection pads is arranged at, e.g., under, C6 pin position according to ISO 7816.

FIG. 5A shows a front view of a carrier tape 10 or IC module 30; FIG. 5B shows a rear view of the carrier tape 10 of FIG. 5A; FIG. 5C shows a rear view of an IC module 30 fabricated on the carrier tape 10 of FIG. 5B. For illustration of comparison, it is to be appreciated that in the carrier tape of FIG. 1B and the IC module of FIG. 1C, antenna-connection pads 22, 34 are provided under the second subset 18 of the conductive pads which include a conductive pad between C1 and C5 pin positions, and another conductive pad between C3 and C7 positions. However, in the carrier tape 10 of FIGS. 5A and 5B and in IC module 30 of FIGS. 5A and 5C, antenna-connection pads 22, 34 would be provided under the second subset 18 of the conductive pads which include a conductive pad between C3 and C7 pin positions or between C1 and C5 positions (not shown), and another conductive pad at the C6 pin position. Alternatively, in some other embodiments (not shown), at least one of the second subset 18 of the conductive pads may be arranged according to C4 or C8 pin position of ISO 7816.

It is to be appreciated that dimensions of holes of the second subset 14 of the through holes may be substantially different to each other (shown in FIGS. 5B and 5C) or substantially similar (not shown).

It is to be appreciated that the conductive pads 17, 18 may be arranged in an array of rows and columns, wherein the second subset 14 of the through holes are provided at some of the conductive pads which are arranged in different rows and columns.

According to some aspects of the invention, methods for fabricating IC modules having direct chip attachment are provided. FIG. 6A provides a flow sequence of a non-limiting method which may produce the carrier tape of FIGS. 1A and 1B.

In block 601, IC chips are provided or produced. This block may include chip redistribution layer (RDL) and bumping wafer process as known to persons skilled in the art for producing IC chip.

In block 602, carrier tapes (or printed circuit boards, PCBs) such as that shown in FIGS. 1A and 1B are fabricated. Features of the carrier tapes or PCBs as described above are applicable here and will not be repeated.

In particular, block 602 includes perforating a non-conductive substrate to produce through holes extending from a front side to a rear side of the substrate; plating a smart card contact area on the front side of the substrate, the smart card contact area having a plurality of conductive pads which are mutually insulated and close front-side ends of the through holes; plating through-hole solder pads on the rear side of the substrate, wherein the through-hole solder pads are arranged at rear-end sides of the through holes; plating a plurality of conductive traces on the rear side of the substrate, wherein the conductive traces are conductively coupled to the through-hole solder pads; and applying a solder mask at least partially overlaying the conductive traces.

In block 603, solder is applied to the carrier tapes such as by solder paste printing. Accordingly, at each carrier tape, a first solder is deposited into the first subset of the through-hole and the first subset of the through-hole solder pads; a second solder is deposited into the second subset of the through-hole and the second subset of the through-hole solder pads; a third solder is deposited on the surface-mounted solder pads.

In block 604, IC chips are arranged or placed on the carrier tapes. In particular at each carrier tape, an IC chip is placed on the solder on the surface-mounted solder pads.

In block 605, the solder deposited in block 603 is reflowed, thereby conductively coupling, e.g., bonding or attaching, the IC chip to the surface-mounted solder pads at each carrier tape. After reflow, the through holes are at least substantially filled with reflowed solder and the through-hole solder pads are provided with reflowed solder.

In block 606, IC chips are underfilled, e.g. provided with an epoxy material, to close a gap between each IC chip and the rear side of each PCB, and the underfill material is cured such as by thermal curing. Direct chip attachment IC modules are thereby produced. An encapsulant may be provided or deposited on the IC chip.

In block 607, plasma cleaning of the IC modules is performed to remove contaminants from the PCBs.

In block 608, a sheet containing the above-mentioned IC modules is cut or punched into the desired dimensions, e.g., strips.

In block 609, the strips are connected to produce elongated strips of carrier tapes.

In block 610, the IC modules are tested.

In block 611, the IC modules are visually inspected.

In block 612, the elongated or connected strips are packaged such as into reels.

It is to be appreciated that the above-described method may comprise fewer or more steps, or the above-described steps may be interchanged, omitted, modified, and/or combined.

According to some aspects of the invention, methods for fabricating circuit board inlay, such as the circuit inlays 3 illustrated in FIGS. 2B, 2D and 2E, are provided. Circuit inlays 3 based on FIGS. 2B and 2D may be without IC modules 13 which are conductively coupled to the circuit inlays at a later step, while circuit inlays 3 based on FIG. 2E may be fabricated with IC modules 31. A non-limiting method incorporates the method described with reference to FIG. 6A or part thereof. In particular, the dimensions of non-conductive substrate provided in the method of FIG. 6A may be approximate to the dimensions of smart card contact area according to ISO 7816 or may be multiples of dimensions of the smart card contact area, e.g., around the size of the final card or device, ID-1 size. Further conductive layers, such as traces, pads, may be provided and/or formed on the front and/or rear side of the circuit board inlay to provide for the card circuitry, the LED circuitry, and/or the biometric circuitry. As such, the circuit board inlay may be equivalent to the carrier tape in such examples.

According to some aspects of the invention, methods for fabricating smart cards or smart devices are provided. FIG. 6B provides a flow sequence of a non-limiting method which may produce a smart card from the IC module of FIGS. 1A, 1C to 1F, 5A and 5C is described as follows:

In block 613, a circuit board inlay (without IC module) may be interposed between other substrate layers and/or overlays and arranged in a stacked arrangement, and laminated as known to persons skilled in the art to produce a laminated core. The laminated core may be milled to provide a first cavity to receive an IC module. At the cavity, the laminated core may be further milled to provide a plurality of second cavities, which are smaller than the first cavity, to expose antenna portions or ends of an antenna, e.g., card antenna which is embedded in the laminated core.

In block 614, the exposed antenna portions or ends are arranged on or proximate to the second solder on the antenna-connection pads.

In block 615, the second solder is reflowed, thereby conductively coupling the antenna to the antenna-connection pads. In particular, heat is applied to the second subset of the conductive pads (heat transfer pads) which are opposed to the antenna-connection pads. The applied heat is transferred via the second subset of the conductive pads (heat transfer pads) and the reflowed solder in the second subset of the through holes to the reflowed solder at the antenna-connection pads.

When the reflowed solder at the antenna-connection pads is melted, the melted solder couples or joins to the antenna portion which is arranged in contact with the melted solder. When the melted solder is cooled, the antenna-connection pads are conductively coupled, e.g., securely joined, to the antenna, thereby conductively coupling the antenna to the IC chip. In other words, an electrical path is provided from the antenna to the IC chip through the antenna-connection pads, the second subset of the conductive traces, and the second subset of the surface-mount solder pads. Heat and/or pressure may be applied to the laminated core to embed the IC module in the laminated core, particularly the circuit board inlay, to provide a smart card or device.

Figure 7A:
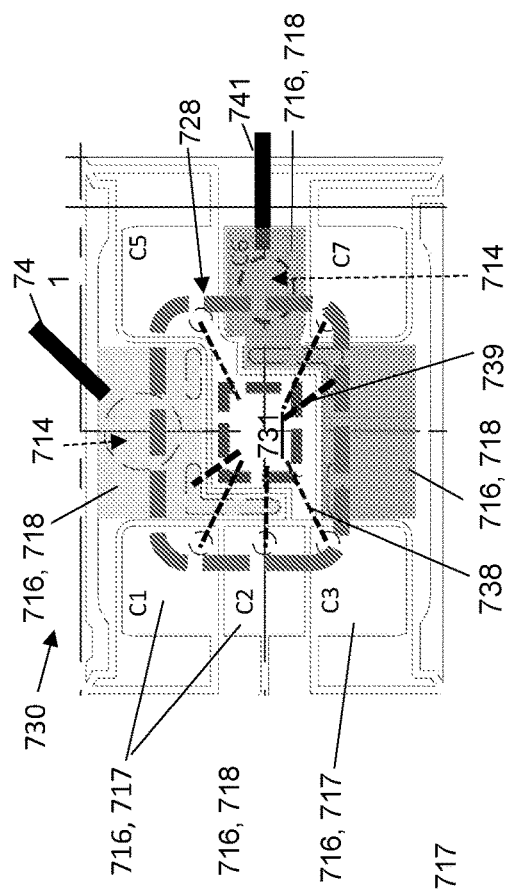
FIG. 7A shows a front view of a carrier tape or IC module according to an embodiment.
Figure 7B:
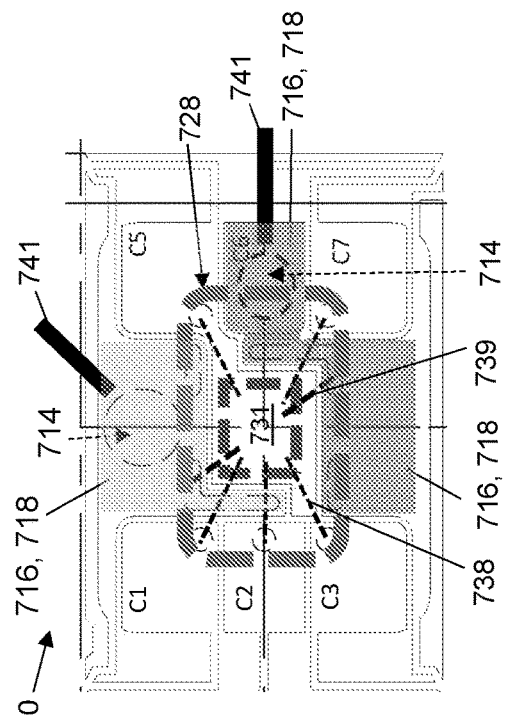
FIG. 7B shows a see-through view taken from a front side of the IC module of FIG. 7A according to an embodiment.
Figure 7C:
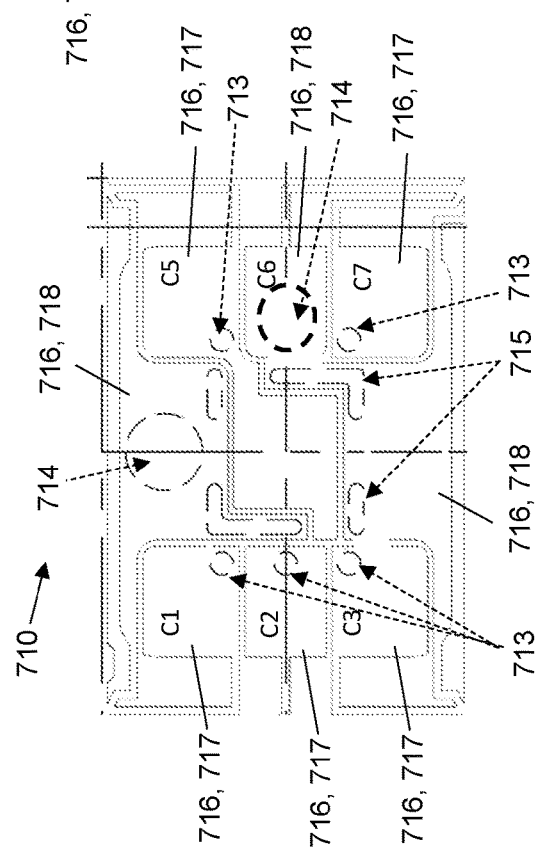
FIG. 7C shows a see-through view taken from a front side of the IC module of FIG. 7A according to an embodiment.

According to some aspects of the invention, other embodiments of carrier tapes and IC modules having antenna-connection pads, which are non-diametrically opposed with respect to the IC chip or arranged on adjacent sides of the IC chip or smart card contact area, are provided. FIGS. 7A to 7C provide non-limiting embodiments in which one of the antenna-connection pads is arranged at C6 pin position.

FIG. 7A shows a see-through front view which is taken from a contact side of a single-side plated IC carrier tape 710 having a smart card contact area 716 which includes a plurality of conductive pads 717, 718, e.g., six ISO designated contact pads. FIG. 7B shows a see-through front view of an IC module 730 incorporating the carrier tape 710 of FIG. 7A according to an embodiment. FIG. 7C shows a see-through front view of an IC module 730 incorporating the carrier tape 710 of FIG. 7A according to another embodiment. In FIGS. 7A to 7C, dash lines/arrows denote elements which is only visible from the rear view which is taken from a bonding side of the carrier tape 710.

The carrier tape 710 includes a non-conductive substrate 711 having a front or contact side (may be referred to as first side) and a rear side or bonding side (may be referred to as second side), a plurality of through holes extending through the substrate 711, e.g. from the front side to the rear side, and conductive pads 717, 718 provided on the front and the rear sides such as by plating and/or etching.

The through holes 713, 714, 715 include a first subset 713, a second subset 714, and a third subset 715 of the through holes. Each through hole 713, 714, 715 has opposed openings or ends, e.g., front-side end and rear-side end which are respectively located at the front side and rear side of the non-conductive substrate 711. The through holes 713, 714, 715 may be provided with different dimensions and/or shapes. In some non-limiting embodiments, the second subset 714 of the through holes have larger dimensions or areas than the first subset 713 of the through holes. For example, diameter of the first subset 713 of the through holes may be about 0.6 mm to about 0.9 mm while diameter of the second subset 714 of the through holes may be about 2.0 mm. However, in other non-limiting examples, the second subset 714 of the through holes may have similar dimensions or areas relative to the first subset 713 of the through holes. In yet other non-limiting examples, some of the through holes may have similar dimensions or areas while some others of the through holes may have different dimensions or areas. The first, the second and/or the third subset 713, 714, 715 of the through holes may take on one or more shapes, e.g., regular shapes, irregular shapes. Non-limiting examples include circle, rounded rectangle, L-shape, ellipse, polygon, combination of interconnecting or overlapping regular shapes. Shapes of the first, the second and/or the third subset 713, 714, 715 of the through holes may be similar and/or distinct.

The first subset 713 of the through holes which are located at C1, C2, C3, C5, and C7 pin positions may be referred to as chip-bonding holes, where each hole 713 is configured to receive a conductive element 738, e.g., wire bond, which is to conductively couple to an IC chip. The second subset 714 of the through holes may be referred to as antenna-bonding holes, where each hole 714 is configured to receive antenna wires/terminals or antenna-connecting elements conductively coupled to antenna wires/terminals. The third subset of the through holes 715 may be referred to as chip-to-antenna connection pad bonding holes, where each hole 715 is configured to receive a conductive element 739, e.g., wire bond, which is to conductively couple the IC chip to an antenna-connection pad 722. The second subset 714 of the through holes are separated from the third subset 715 of the through holes by the non-conductive substrate 711.

A smart card contact area 716 is arranged on the front side of the substrate 711 and closes up front-side ends of the through holes 713, 714, 715. The smart card contact area 716 includes a plurality of conductive pads 717, 718 wherein at least some are conductively insulated from one another. The conductive pads 717, 718 may be sized, shaped and arranged in compliance with International Organization for Standardization (ISO) standards for the manufacture of smart cards. Dimensions of the smart card contact area 716 may be about 85.60 mm×53.98 mm according to ISO 7816 standard. The conductive pads 717, 718 may be made of metal, e.g., copper, nickel. The conductive pads 717, 718 include a first subset 717 and a second subset 718 of the conductive pads. Each conductive pad 717 of the first subset 717 includes an external side and an internal side so that in operation the external side makes electrical contact with a contact-type smart card reader or electronic terminal to allow signal transmission between the card reader and an IC chip electrically connected to the smart card contact area 716, while the internal side is accessible through a corresponding through hole to allow a conductive element 738, e.g. wire, to be disposed therein to establish electrical connection with the conductive pad 717. However, each conductive pad 718 of the second subset 718 may not make electrical contact with contact-type smart card reader or electronic terminal. Unlike in FIGS. 1A to 1F where the second subset 18 of the conductive pads provide heat transfer pads, the second subset 718 of the conductive pads of FIGS. 7A to 7C may not be used for heat transfer but are used as electrical conductor.

The first subset 717 of the conductive pads may be arranged according to C1, C2, C3, C5, C7 pin positions of ISO 7816. The second subset 718 includes a conductive pad between C3 and C7 pin positions or between C1 and C5 positions (not shown), and another conductive pad at the C6 pin position. Alternatively, in some other embodiments (not shown), at least one of the second subset 718 of the conductive pad may be arranged according to C4 or C8 pin position according to ISO 7816.

In the embodiments of FIGS. 7A to 7C, the conductive pads 717, 718 may be arranged in an array of rows and columns, wherein the second subset 714 of the through holes are provided at some of the conductive pads which are arranged in different rows and columns. As shown, an area of one of the second subset 718 of the conductive pads traverses more than one row and column.

In particular, the front side of the carrier tape 710 or IC module 730 provides C1, C2, C3, C5, C6, C7 which are six ISO designated contact (conductive) pads. A first antenna-connection pad 718 is provided by one of the conductive pads which is between C1 and C5, while a second antenna-connection pad 718 may be provided by a combination of an ISO designated contact pad which is conventionally unused, i.e., C6 pin position, and another one of the conductive pads which is between C3 and C7. In other words, the conductive pads which provide the second antenna-connection pad are conductively coupled.

As shown in FIGS. 7B and 7C, the first subset 717 of the conductive pads close front-side ends of the first subset 713 of the through holes while the second subset 718 of the conductive pads close front-side ends of the second subset 714 and the third subset 715 of the through holes.

As shown in FIGS. 7B and 7C, an encapsulant 728 is provided or deposited on the rear side or bonding side of the substrate 711. In particular, the encapsulant 728 is deposited in the first subset 713 and the third subset 715 of the through holes, and further deposited on the IC chip 731 and the conductive elements, e.g., wire bonds (see dash lines 738, 739 from the IC chip 731 to holes 713, 715 respectively), which traverse the first subset 713 and the third subset 715 of the through holes. However, the encapsulation area may vary in different embodiments as the encapsulant 728 may or may not be deposited in the second subset 714 of the through holes.

In the IC module 730 of FIG. 7B, the encapsulant 728 is deposited into the second subset 714 of the through holes, i.e., both antenna-bonding holes 714, such that each hole 714 is partially encapsulated and partially unencapsulated. Hence, connections to an antenna 741 in card body (not shown) would traverse the partially unencapsulated portions of the antenna-bonding holes 714.

In the IC module 730 of FIG. 7C, the encapsulant 728 is deposited into one of the second subset 714 of the through holes, i.e., only one antenna-bonding hole 714, such that this hole 714 is partially encapsulated and partially unencapsulated. Hence, a connection to an antenna 741 in card body (not shown) would traverse the partially unencapsulated portion of this antenna bonding-hole 714. The other one of the second subset of the through holes, i.e., another antenna-bonding hole, is free of encapsulation, i.e., unencapsulated. Hence, another connection to the antenna 741 in card body (not shown) would traverse the fully unencapsulated antenna-bonding hole 714.

In another embodiment of an IC module (not shown), the encapsulant is deposited on the rear side of the substrate without being deposited into any of the second subset 714 of the through holes. In other words, both the antenna-bonding holes 714 are free of encapsulation, i.e., unencapsulated.

In both FIGS. 7B and 7C, at each antenna-connection or bonding pad 718, the antenna bonding hole 714 and the third subset 715 of the through holes, e.g., L-shape, elongate, and/or other suitably-shaped bonding hole, terminate at the antenna-connection or pad 718. An antenna 741 in card body would be conductively coupled to the IC chip 731 through antenna-connecting elements arranged in antenna-bonding holes and through the conductive elements 739 arranged in the third subset 715 of the through holes. Each antenna-connecting element may include a rigid conductive or solder bump, a conductive disc, a flexible conductive bump comprising an electrically conductive adhesive, or a portion of the antenna 741.

Accordingly, each antenna-bonding hole 714 is configured to allow at most one conductive element, e.g., a single wire or connection element, which is to connect an antenna 741 to the antenna-connection pad 718. At each antenna-bonding hole 714, there is no wire or other electrical connection which is to connect the IC chip 731 to the antenna-connection pad 718.

According to some aspects of the invention, other embodiments of a smart card having both contact and contactless interfaces and incorporating the IC module of FIGS. 7B or 7C are provided. The smart card comprises: a card body having an opening and an antenna 741; and the IC module 730 of FIG. 7B or 7C disposed in the opening; antenna-connecting elements arranged in the antenna-bonding holes 714 of the IC module 730 and conductively coupling the antenna 741 to the antenna-connection pads 718. The card body may include a laminated core of substrate layers wherein the antenna may be interposed between the substrate layers, e.g., arranged on one of the layers.

Embodiments of the invention provide several advantages, including but not limited to the following:

Embodiment of FIGS. 1A to 1F provides an alternative to existing smartcard substrate, carrier tape and IC module. It also provides an alternative to fabrication process which incorporates surface mounting technology on a high-density substrate to increase productivity.

Embodiment of FIGS. 1G, 2F and 2G provides an alternative which eliminates conductive coupling via physical connection between IC chip and card antenna, thus resulting in increased reliability and lifespan of smart card.

Embodiments of FIGS. 2A to 2E provide alternatives to smartcard contact area connection design.

Embodiment of FIGS. 5A to 5C provide an alternative to antenna connection design which utilises the bonding hole of an unused pin and also an alternative to embedding process to integrate IC modules into card body construction.

Embodiments of FIGS. 7A to 7C provide an alternative to antenna connection design which utilises the bonding hole of an unused pin and which also allows a single-side plated carrier tape to be used in assembly process to achieve cost reduction due to significant raw material reduction for the bonding orientation design.

It is to be understood that the embodiments and features described above should be considered exemplary and not restrictive. Many other embodiments will be apparent to those skilled in the art from consideration of the specification and practice of the invention. Furthermore, certain terminology has been used for the purposes of descriptive clarity, and not to limit the disclosed embodiments of the invention.

What is claimed is:

1. An article of manufacture comprising:
a non-conductive substrate having a front side and a rear side, and a plurality of through holes extending from the front side to the rear side;
a smart card contact area arranged on the front side of the substrate and having a plurality of conductive pads which are mutually insulated and close front-side ends of the through holes;
characterized in that the article of manufacture further comprises:
a plurality of through-hole solder pads and a plurality of conductive traces arranged on the rear side of the substrate, wherein the through-hole solder pads are arranged at rear-side ends of the through holes, wherein the conductive traces are conductively coupled to the through-hole solder pads respectively;
a solder mask at least partially overlaying the conductive traces;
a first solder arranged in a first subset of the through holes and on a first subset of the through-hole solder pads, and configured to conductively couple a first subset of the conductive pads to a first subset of the conductive traces; and an integrated circuit (IC) chip conductively coupled to the first subset of the conductive traces by direct chip attachment, thereby conductively coupling the IC chip to the first subset of the conductive pads at least via the first subset of the conductive traces, the first subset of the through-hole solder pads, and the first solder.

2. The article of manufacture of claim 1, further comprising:

an underfill material interposed between the IC chip and the rear side of the substrate and/or an encapsulant provided on the IC chip, wherein the rear-side ends of the through holes are substantially free of the underfill material, the solder mask and/or the encapsulant.

3. The article of manufacture of claim 2, further comprising:

a second solder arranged in a second subset of the through holes and on a second subset of the through-hole solder pads, wherein the second subset of the solder pads and the second solder are co-operable to provide a plurality of antenna-connection pads, wherein the IC chip is conductively coupled to the second subset of the through-hole solder pads through the second subset of the conductive traces, the article of manufacture further comprising:

an antenna conductively coupled to the antenna-connection pads, thereby conductively coupling the antenna to the IC chip.

4. The article of manufacture of claim 3, further comprising:

a biometric circuitry conductively coupled to the IC chip; and/or a light emitting diode (LED) circuitry, which includes at least one LED module and a second antenna conductively coupled thereto, wherein the second antenna is configured to be inductively coupled to a contactless reader to operate the at least one LED module.

5. A method for fabricating a smart card, the method comprising:

conductively coupling an antenna to the antenna-connection pads of claim 3, thereby conductively coupling the antenna to the IC chip.

6. The article of manufacture of claim 1, further comprising:

surface-mount solder pads arranged on the rear side of the substrate and conductively coupled to the first subset of the through-hole solder pads through the first subset of the conductive traces;

wherein the IC chip is arranged under the smart card contact area and conductively coupled to the surface-mount solder pads.

7. The article of manufacture of claim 1, wherein the second subset of the through holes are non-diametrically opposed with respect to the IC chip.

8. The article of manufacture of claim 1, wherein at least some of the conductive pads are arranged in an array of rows and columns, wherein the second subset of the through holes are arranged in different rows and columns.

9. The article of manufacture of claim 1, wherein one of the second subset of the through holes is arranged at C6 pin position according to ISO 7816.

10. The article of manufacture of claim 1, wherein the IC chip is arranged offset with respect to the smart card contact area.

11. The article of manufacture of claim 1, wherein the substrate is dimensioned according to ID-1 size, half ID-1 size, or quarter ID-1 size according to ISO 7810.

12. The article of manufacture of claim 1, wherein the substrate, the smart card contact area, the through-hole solder pads, the conductive traces, the solder mask, the first solder and the second solder are provided as a printed circuit board.

13. The article of manufacture of claim 1, wherein the conductive traces include a module antenna at least partially surrounding the through-hole solder pads.

14. A smart card comprising:

a laminated core comprising a plurality of laminated layers, wherein one of the laminated layers comprises the article of manufacture of claim 1.

15. A method for fabricating an article of manufacture, the method comprising:

perforating a non-conductive substrate to produce through holes extending from a front side to a rear side of the substrate;

plating a smart card contact area on the front side of the substrate, the smart card contact area having a plurality of conductive pads which are mutually insulated and close front-side ends of the through holes; characterized in that the method further comprises:

plating through-hole solder pads on the rear side of the substrate, wherein the through-hole solder pads are arranged at rear-end sides of the through holes;

plating a plurality of conductive traces on the rear side of the substrate, wherein the conductive traces are conductively coupled to the through-hole solder pads;

applying a solder mask at least partially overlaying the conductive traces; and depositing a first solder in a first subset of the through holes and on the first subset of the through-hole solder pads, wherein the first solder is configured to conductively couple a first subset of the conductive pads to a first subset of the conductive traces through the first subset of the through-hole solder pads;

depositing a second solder in a second subset of the through holes and on the second subset of the solder pads, thereby allowing the second subset of the through-hole solder pads and the second solder to co-operably provide a plurality of antenna-connection pads;

depositing a third solder on a plurality of surface-mount solder pads at ends of the conductive traces which are distal from the through-hole pads;

arranging an integrated circuit (IC) chip on the rear side of the substrate; and reflowing at least the first solder, the second solder, and the third solder, thereby conductively coupling the IC chip to the first subset of conductive pads through the first subset of the conductive traces, and conductively coupling the IC chip to the second subset of the through-hole solder pads.

16. The method of claim 15, further comprising:

providing an underfill material interposed between the IC chip and the substrate;

providing an encapsulant on the IC chip;

maintaining the rear-side ends of the through holes substantially free of the underfill material, the solder mask and/or the encapsulant.

17. The method of claim 16, wherein the IC chip is conductively coupled to the second subset of the solder pads through the second subset of the conductive traces, the method further comprising:

conductively coupling an antenna to the antenna-connection pads, thereby conductively coupling the antenna to the IC chip.

18. An integrated circuit (IC) module for a smart card with both contact and contactless interfaces, the IC module comprising:
- a non-conductive substrate having a plurality of through holes extending from a front side to a rear side of the substrate, wherein the through holes include a first subset, a second subset, and a third subset of the through holes;
- a smart card contact area arranged on the front side of the substrate and having a plurality of conductive pads which include a first subset of the conductive pads arranged to respectively close the first subset of the through holes respectively, and a second subset of the conductive pads arranged to close the second subset and the third subset of the through holes;
- an IC chip arranged on the rear side of the substrate;
- a plurality of conductive elements traversing the first subset and the third subset of the through holes and conductively coupling the first subset and the second subset of the conductive pads to the IC chip; and
- an encapsulant deposited in the first subset and the third subset of the through holes, wherein the encapsulant is further deposited on the IC chip and the conductive elements,
- wherein the second subset of the through holes are separated from the third set of the through holes by the substrate,
- wherein the second subset of the through holes are non-diametrically opposed with respect to the IC chip.

19. The IC module of claim 18, wherein at least some of the conductive pads are arranged in an array of rows and columns, wherein the second subset of the through holes are arranged in different rows and columns.

20. The IC module of claim 18, wherein one of the second subset of the conductive pads includes an area which traverses more than one row and column.

21. The IC module of claim 18, wherein the encapsulant is further deposited in at least one of the second subset of the through holes.

22. The IC module of claim 18, wherein at least one of the second subset of the through holes is adapted to receive the encapsulant.

23. The IC module of claim 18, wherein one of the second subset of the conductive pads is arranged at C6 pin position according to ISO 7816.

24. The smart card of claim 18, wherein each of the second subset of the through holes is adapted to receive at most one conductive element.

25. A smart card with both contact and contactless interfaces, the smart card comprising:
- a card body having an opening and an antenna; and
- the integrated circuit (IC) module of claim 18, which is disposed in the opening;
- a pair of antenna-connecting elements arranged in the second subset of the through holes and conductively coupling the antenna to the second subset of the conductive pads.

26. The smart card of claim 25, wherein each of the antenna-connecting elements includes a rigid conductive or solder bump, a conductive disc, a flexible conductive bump comprising an electrically conductive adhesive, or a portion of the antenna.

27. A single-side plated integrated circuit (IC) carrier tape adapted for use in smart card with both contact and contactless interfaces, the IC carrier tape comprising:
- a non-conductive substrate having a plurality of through holes extending from the front side to the rear side of the substrate, wherein the through holes include a first subset, a second subset, and a third subset of the through holes; and
- a smart card contact area arranged on the front side of the substrate and having a plurality of conductive pads which include a first subset of the conductive pads arranged to respectively close the first subset of the through holes, and the second subset of the conductive pads arranged to close the second subset and the third subset of the through holes,
- wherein the second subset of the through holes are separated from the third set of the through holes by the substrate,
- wherein the conductive pads are arranged in an array of rows and columns, wherein the second subset of the through holes are provided at some of the conductive pads which are arranged in different rows and columns.

28. The carrier tape of claim 27, wherein an area of one of the second subset of the conductive pads traverses more than one row and column.

29. The carrier tape of claim 27, wherein one of the second subset of the conductive pads is arranged at a C6 pin position according to ISO 7816.

* * * * *